United States Patent
Perez Lopez et al.

(10) Patent No.: US 12,013,569 B2
(45) Date of Patent: Jun. 18, 2024

(54) METHOD OF CONFIGURATION AND OPTIMISATION OF PROGRAMMABLE PHOTONIC DEVICES

(71) Applicant: UNIVERSITAT POLITÉCNICA DE VALÈNCIA, Valencia (ES)

(72) Inventors: Daniel Perez Lopez, Valencia (ES); Jose Capmany Francoy, Valencia (ES); Ivana Gasulla Mestre, Valencia (ES)

(73) Assignee: UNIVERSITAT POLITECNICA DE VALENCIA (UPV), Valencia (ES)

( * ) Notice: Subject to any disclaimer, the term of this patent is extended or adjusted under 35 U.S.C. 154(b) by 530 days.

(21) Appl. No.: 17/295,314

(22) PCT Filed: Oct. 14, 2019

(86) PCT No.: PCT/ES2019/070696
§ 371 (c)(1),
(2) Date: Jan. 6, 2022

(87) PCT Pub. No.: WO2020/104716
PCT Pub. Date: May 28, 2020

(65) Prior Publication Data
US 2022/0221647 A1    Jul. 14, 2022

(30) Foreign Application Priority Data
Nov. 19, 2018  (ES) .................................. 201831118

(51) Int. Cl.
*G02B 6/125*  (2006.01)
*G02B 6/293*  (2006.01)
(Continued)

(52) U.S. Cl.
CPC ......... *G02B 6/125* (2013.01); *G02B 6/29355* (2013.01); *G02B 6/29395* (2013.01);
(Continued)

(58) Field of Classification Search
CPC  G02B 6/125; G02B 6/29355; G02B 6/29395; G02B 6/43; G02B 2006/12147; G02B 2006/12159
See application file for complete search history.

(56) References Cited

U.S. PATENT DOCUMENTS 9,753,224 B2 * 9/2017 Miller ................. G02B 6/2935
2015/0086203 A1  3/2015 Boduch et al.
(Continued)

FOREIGN PATENT DOCUMENTS

WO   2004015471 A2   2/2004
WO   2016028363 A2   2/2016

OTHER PUBLICATIONS

Depeng Mao, "All-Optical Programmable Photonic Integrated Circuit: An Optical Analogy To Electronic FPGA", Article, Jun. 2011, 2674-2677, Transducers' 11.
(Continued)

*Primary Examiner* — Daniel Petkovsek
(74) *Attorney, Agent, or Firm* — Hayes Soloway PC

(57) ABSTRACT

The method object of the invention enables the scalable configuration and performance optimisation to be carried out for programmable optical circuits based on meshed structures, in such a way that they can perform optical/quantum signal processing functions. The object of the invention can be applied in circuits with arbitrary degrees of complexity implemented by means of programming a waveguide mesh. The method object of the invention enables not only the analysis and evaluation of performance to be carried out, but also the subsequent programming and optimisation of programmable optical devices.

16 Claims, 16 Drawing Sheets

(51) Int. Cl.
    *G02B 6/43*    (2006.01)
    *G02B 6/12*    (2006.01)
(52) U.S. Cl.
    CPC ...... *G02B 6/43* (2013.01); *G02B 2006/12147* (2013.01); *G02B 2006/12159* (2013.01)

(56) References Cited

U.S. PATENT DOCUMENTS

2018/0139005 A1    5/2018  Boduch et al.
2018/0234177 A1    8/2018  Li et al.
2018/0335574 A1*  11/2018  Steinbrecher ...... H04Q 11/0005

OTHER PUBLICATIONS

Daniel Perez, "Reconfigurable Lattice Mesh Designs for Programmable Photonic Processors and Universal Couplers", Article, 2016, 1-4, ICTON 2016.
Daniel Perez, "Multipurpose silicon photonics signal processor core", Article, 2017, 1-9, vol. 6, Nature Communications.
Daniel Perez, "Silicon RF-Photonics Processor Reconfigurable Core", Article 2017, 1-3, IEEE.

* cited by examiner

METHOD OF CONFIGURATION AND OPTIMISATION OF PROGRAMMABLE PHOTONIC DEVICES

CROSS-REFERENCE TO RELATED APPLICATIONS AND PRIORITY

This patent application claims priority from PCT Patent Application No. PCT/ES2019/070696 filed Oct. 14, 2019, which claims priority from Spanish Patent Application No. P201831118 filed Nov. 19, 2018. Each of these patent applications are herein incorporated by reference in their entirety.

OBJECT OF THE INVENTION

The object of the invention falls within the technical field of physics.

More specifically, the scope of the object of the invention is within the field of photonics.

BACKGROUND OF THE INVENTION

There is extensive literature on programmable optical integrated structures. We can differentiate them into two types: a first set of devices that offer the programming of subsystems and access thereto and a second based on the complete discretisation of all the subsystems and routing systems in waveguides that make up meshed structures. Optical switching matrices can be classified between both types.

Programmable Multifunctional Photonics (PMP) seeks to design common integrated optical systems by means of hardware configurations that can implement a wide variety of functionalities by means of programming. Several authors have produced theoretical works proposing different configurations and design principles based on the cascade of beam splitters or integrated Mach Zehnder interferometers (MZIs).

A more versatile architecture can be obtained by following principles similar to those of developments based on field programmable gate arrays (FPGA) in electronics giving rise to programmable photonic gate arrays (FPPGA). The main concept is to break down complex circuits into a large network of identical unitary tuning units implemented and interconnected by means of an integrated two-dimensional (2D) waveguide mesh or network. In this way, different functionalities can be obtained by selecting the appropriate pathway through the mesh and the local offsets. Thus, a complex functionality is synthesised by programming optical interferences activating the necessary resources within the mesh. Integrated 2D meshes formed by the replication of a tuning unit form uniform cells (square, hexagonal or triangular) that provide regular and periodic geometries, wherein each side of the basic cell is implemented by means of two waveguides coupled by an independent (power and phase division) tunable basic unit (TBU).

Today, configurations with a reduced number of cells (i.e., up to seven) have been demonstrated which show the ability to emulate both traditional signal processing architectures and commonly used arbitrary linear matrix transformations as the basis for most applications targeted to photonic chips. For example, in quantum information, support of N×N transformations for implementing simple and complex logic gates, emulation of boson sampling circuits, and quantum lab-on-a-chip.

Waveguide meshes pave the way for large-scale reconfigurable integrated quantum information systems with the potential to replace current approaches based on static configurations. In computer processor interconnections, the reconfigurable broadband interprocessor and computer interconnections are essential in high-performance computing and data centres. Photonic linear transformations provide a clean, crosstalk-free, high-speed option for core processor resource management. In optical signal the processing and linear transformations that can be compatible with PMN processors based on the 2D mesh waveguide include several operations that are fundamental for the processing of the optical signal, such as, for example: Optical FFT, Hilbert transformation, integrators and differentiators. In neurophotonics, unitary (N×M) and non-unitary (N×M) matrix transformations are fundamental elements that precede non-linear threshold operations in neural networks. The availability of PMP processors opens an interesting research avenue in this emerging field. In biophotonics, PMPs support the implementation of single and multiple input/multiple output (MIMO) sensors that enable interferometric structures to be implemented for lab-on-a-chip capable of detecting a multiplicity of parameters.

Last but not least, in advanced physics, the waveguide mesh provides a programmable 2D platform to implement different topological systems such as multi-ring cavity structures to support research in synthetic dimensions and devices based on Topological Isolation Principles.

The extension of the 2D waveguide meshes to account for a greater number of TBUs (>80) is imperative to implement more complex structures and leads to large scale (LS) or very large scale (VLS) photonic integrated circuits.

Scalability dramatically increases the amount of functionality that can be implemented with a given hardware. However, the scalability of the waveguide meshes causes the configuration and performance obtained from programmed circuits to be affected by excessive losses, levels of unwanted optical interference and an increase in the complexity of system configuration. The global configuration of the mesh based only on an initial mapping that assumes the ideal behaviour of the TBUs becomes less reliable as the number of TBUs increases. In addition, poor performance of a single TBU can cause serious deterioration in the overall behaviour of the circuit. Furthermore, as with any optical circuit with non-ideal elements, performance is reduced by the accumulation of unwanted optical interference. For example, in the practical case of switching matrix synthesis/emulation, a portion of the output signal can be routed to unwanted ports acting as noise. The degree of unwanted coupling depends on the degree of optical interference of each component (TBU in the case of waveguide meshes). For the same reason, a mesh of waveguides emulating two circuits at the same time causes an unwanted coupling between the two. The physical connection between the two is evident and the levels of unwanted interference can again limit the performance obtained.

To overcome these physical and design limitations, a scalable method of performance configuration and optimisation must be available. This method is also essential to perform an optimal technological mapping of the circuit to be emulated on the hardware resources offered by the mesh. The core of this method requires a correct spectral characterisation represented by the overall dispersion matrix of the system. Once obtained, different optimisation algorithms should modify the parameters of each TBU to cause the desired configuration and performance improvement by evaluating the dispersion matrix. The high number of input/ output ports and the internal interconnections that enable the propagation and re-feeding in multiple directions in the 2D structure mean that conventional configuration and optimisation techniques cannot be used. In fact, the difference between a pure technique of mathematical analysis of a 2D structure and the proposed optimisation process lies herein. While in the first it is only necessary to be able to characterise the effect that the resources used exert on the transfer between the input and output ports of the useful signal, in the optimisation procedures it is necessary to take into account the effect of ALL the resources on all the possible input and output configurations, since the optimisation of the operation of the structure requires having information about the resources used as well as about those that remain, in principle, at rest.

Currently, there is evidence of:

US2015086203A1 "Method and apparatus for optical node construction using field programmable photonics" and US2018139005A1 wherein an apparatus for routing optical signals is respectively described. It is not a programmable signal processor, but a device to route/amplify channels from one port to another with the possibility of selecting the wavelength. These devices are known in the art as optical switching matrices.

US2018234177A1 wherein a programmable integrated circuit matrix for optical tests is described that is defined by a fixed structure to test signal transmission/reception devices. It can modify the type of modulation, powers and speeds.

WO2016028363A2 wherein a programmable photonic integrated circuit is described that implements arbitrary linear optical transformations in spatial mode with high fidelity. Under a realistic manufacturing model, the programmed implementations of the CNOT gate, the CPHASE gate, the iterative phase estimation algorithm, state preparation and quantum random paths are analysed. Programmability dramatically improves the device's tolerance to manufacturing imperfections and enables a single device to implement a wide range of experiments of both quantum and classical linear optics. The results suggest that existing manufacturing processes are sufficient to build such a device on silicon photonics platforms. This document can be understood as referring to an interferometric device that performs linear optical transformations. Said device is only capable of performing progressive combinations of the signal, i.e., the signal cannot be recirculated or combined in simultaneous nodes or nodes of previous levels.

WO2004015471A2 wherein reference is made to a set of functional blocks connected to each other by means of an optical routing/switching matrix. A device is described the functional blocks of which are physically custom manufactured before being programmed. The user chooses whether or not to access the same by means of circuit switching.

Likewise, the document entitled "Reconfigurable lattice mesh designs for programmable photonic processors and universal couplers" by Perez Daniel; Gasulla Ivana; Capmany Jose; Soref Richard A., published at the 2016 18th International Conference on Transparent Optical Networks (ICTON), is known wherein two mesh design geometries, the hexagonal and triangular lattice, are described for implementing tunable optical cores in programmable photonic processors and universal couplers. They are compared to a previously proposed square mesh topology in terms of a series of figures of merit that take into account the metrics that are relevant to the on-chip integration of the mesh, finding that the hexagonal mesh is the most suitable choice. And also, that the document entitled "Multipurpose silicon photonics processor core" (https://www.nature.com/articles/s41467-017-00714-1) by Perez Daniel; Gasulla Ivana; Capmany Jose et al., Published in *Nature communications* on 27 Nov. 2017, describes application-specific photonic integrated circuits, wherein particular circuits/chips are designed to optimally perform particular functionalities. A different approach inspired by electronic field programmable gate matrices is the programmable photonic processor, wherein a common hardware implemented by a two-dimensional photonic waveguide mesh performs different functionalities through programming. More than 20 different functionalities are disclosed with a simple structure of seven hexagonal cells, which can be applied to different fields, including communications, chemical and biomedical detection, signal processing, multiprocessor networks and quantum information systems. Although both documents refer to mesh geometries while proposing and comparing physical architectures and simple configuration examples. However, no method is discussed or proposed for the effective configuration thereof, and performance optimisation for meshes with an arbitrarily high number of TBUs. For example, analytically analysing the presented meshes can be solved in a matter of days. However, going from 4 cells to 20 makes the analytical development thereof with conventional methods inviable. The same goes for the configuration, programming and optimisation of the circuits thereof. Therefore, a method applicable to all types of mesh structures is needed.

Similarly, in the document entitled "All-optical programmable photonic integrated circuit: An optical analogy to electronic FPGA" by the authors Depeng Mao; Peng Liu; Liang Dong, published at the 2011 16th International Solid-State Sensors, Actuators and Microsystems Conference (TRANSDUCERS 2011); Beijing, China; 5-9 Jun. 2011, describes a fully programmable photonic platform of programmable integrated circuits taking advantage of three techniques: two-dimensional silicon photonic crystals, digital micro-mirror devices and photosensitive liquid crystals. This document basically proposes a "programmable" photonic platform of integrated circuits. It is actually a mask-programmed device (with large lab equipment or chip manufacturing company, rather than a field-programmed device. Specifically, it is based on the photosensitivity of the components to modify the effective index of the waveguides and the tuning methodology or mechanism of the platform is described.

DESCRIPTION OF THE INVENTION

The object of the invention is a scalable method of configuration and performance optimisation for programmable optical circuits based on meshed structures, in such a way that they can perform optical/quantum signal processing functions; hereinafter method of the invention or method object of the invention.

The method of the invention comprises, firstly, a discretisation/segmentation/division of the mesh into smaller TBU units or set of replicated TBUs that form the mesh. Next, the core of the method object of the invention requires a correct spectral characterisation represented by the dispersion matrix of the system, that is, the complete frequency response (angle and phase of all input/output ports) of highly coupled structures. Once obtained, different optimisation algorithms modify the parameter or parameters of each TBU to produce the desired configuration and performance improvement; said parameter to be optimised is related to the programming of the programmable optical device, for example it can be selected from the set consisting of: total power consumption, reduction of losses, reduction of interference and crosstalk, isolation between circuits and reduction of the area used. For example, inactive TBUs that are not part of the primary target can be modified to reduce optical interference and provide optimal signal-to-noise ratio by minimising the corresponding values of the system matrix. Furthermore, the system can be partially optimised by respecting a trade-off between total power consumption and optimisation by performing optimisation only on a subset of inactive TBUs. The application of the method enables the viability of highly coupled (meshed) programmable photonic structures, hereinafter meshes, and technical advantages are obtained as a result.

To obtain the dispersion matrix that characterises the system, the high number of input/output ports and internal interconnections that enable the propagation and feedback in multiple directions in the 2D structure mean that conventional configuration and optimisation techniques cannot be used.

By way of non-limiting descriptive explanation, applying the method object of the invention to meshes of hexagonal topology, there is a segmentation of meshes of 2D hexagonal waveguides into basic blocks n−1 blocks formed by three TBUs each (hereinafter tri-TBU). Once segmented, the analytical dispersion matrix that defines the complete mesh is recursively obtained according to the matrix that defined the mesh with n−1 tri-TBUs and the dispersion matrix that defines the new tri-TBU to be incorporated. As a result, the analytical dispersion matrix of any integrated photonic waveguide mesh circuit composed of an arbitrary number of TBUs is obtained. Then, the values of each TBU are modified and the process is repeated to achieve improvements in the desired performance (relative to the operation of specific or generic purpose such as reduction of optical interference, power consumption or accumulated losses in complex programmable photonic circuits.

Again, the method of the invention enables the unused regions (TBUs) of the waveguide mesh to be designed so that they can be used to manage unwanted contributions of reflected and interference signals and therefore optimise the performance of the chip; also enabling all the input/output responses to be studied while the internal parameters of the tunable basic units (TBU) vary, making error optimisation possible through multiparameter optimisation with the incorporation of machine learning algorithms for circuit self-correction.

The method proposed herein is developed for a hexagonal waveguide mesh, however, it can be applied to any uniform and non-uniform 2D mesh topology; the core of the method starts from the application of mathematical induction (MI), which is a technique that can be used to test a particular rule or pattern, generally infinite or arbitrarily large and is based on two steps, a base step wherein a simple case is established and an induction step, which involves showing that an arbitrary large example is logically derived from a slightly smaller one. In mathematical terms, the principle of induction establishes that for a fixed integer b and for each integer n≥b, S (n) is a statement that includes n. If (i) S (b) is true and (ii) for any integer k≥b, S (k)→S (k+1) then for all n≥b, the statement S (n) is true. This seemingly simple principle hides, in fact, a very robust testing technique that finds applications in a wide variety of fields including probability, geometry, game theory, graph theory, system complexity, and artificial systems.

The object of the invention can be applied to programmable photonics, which has applications in innumerable fields, just to name a few:

RF photonics: reconfigurable filters, tunable real-time delay lines, arbitrary phase shifts, waveform generators, ADCs, frequency measurement.

Quantum: Implementation of general N×N unitary transformations that support logic gate operation, random circuit emulation, and quantum lab on a chip.

Telecommunications: Switches, add/drop multiplexers, mode converters in SDM Systems.

Interconnections: Reconfigurable broadband interconnections and computer interconnections.

Optical signal processing: Optical FFTs, Hilbert transforms, integrators, differentiators.

Neurophotonics: Unitary (N×M) and non-unitary (N×M) matrix transformations for Neural Networks, spike and reservoir computing.

Sensors: Support of simple interferometric structures and MIMO for lab-on-a-chip and multi-parameter detection applications.

Advanced physics: Implementation of multi-ring cavity structures to support dimensional synthetic materials.

DESCRIPTION OF THE DRAWINGS

To complement the description that is being made and for the purpose of helping to better understand the features of the invention according to a preferred practical exemplary embodiment thereof, a set of drawings is attached as an integral part of said description in which the following is depicted in an illustrative and non-limiting manner.

For graphs showing the signal flow, the connections N, M, X, Y, F, D E', F', Q, R, C', D', A', B', S, U, I, J, B, F, hyy, hzz, hxx represent signal flow pathways with transfer functions given by the coefficients of the dispersion matrix H(n−1). The connections K, L, O, P, A, H, C, E, T, G, V, W represent the additional signal flow pathways resulting from the additional tri-TBU.

Figure 7:
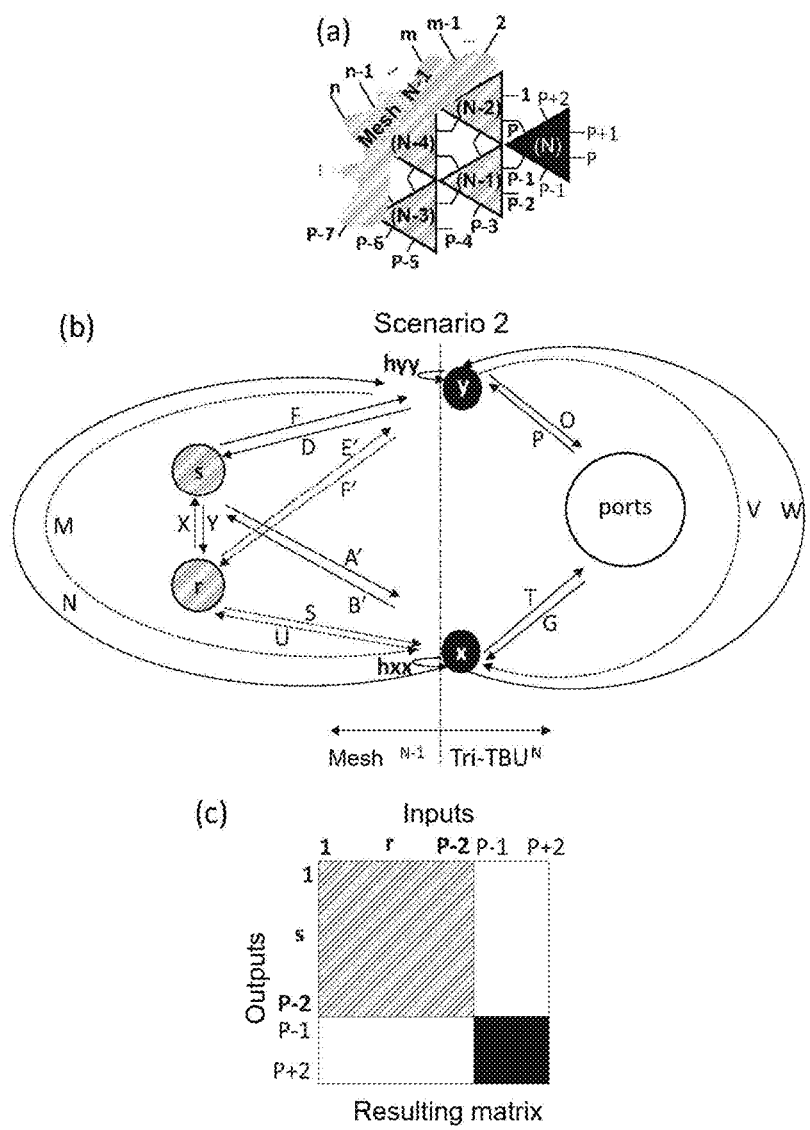

FIG. 7 depicts scenario 2. (a) Connection diagram with n−1 mesh, (b) interconnection diagram with the contributions label, (c) resulting sections of the matrix. x=P−1, y=P. Note that the direct contribution within the ports of network N is not included in the graph.

Figure 8:
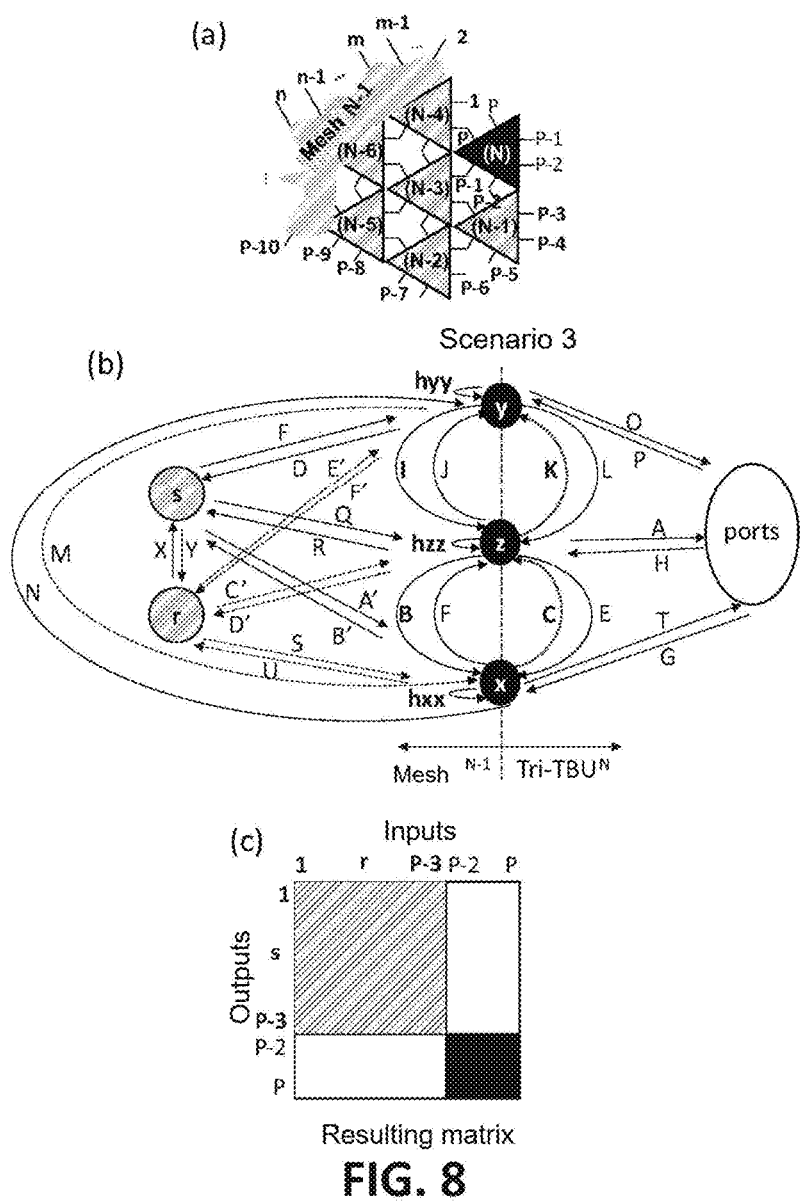

FIG. 8 depicts scenario 3. (a) Connection diagram with mesh n−1, (b) interconnection diagram with labeled contributions, (c) resulting sections of the matrix. x=P−2, y=P−1, z=P. The direct contribution within network ports is not included in the graph.

Figure 9A:
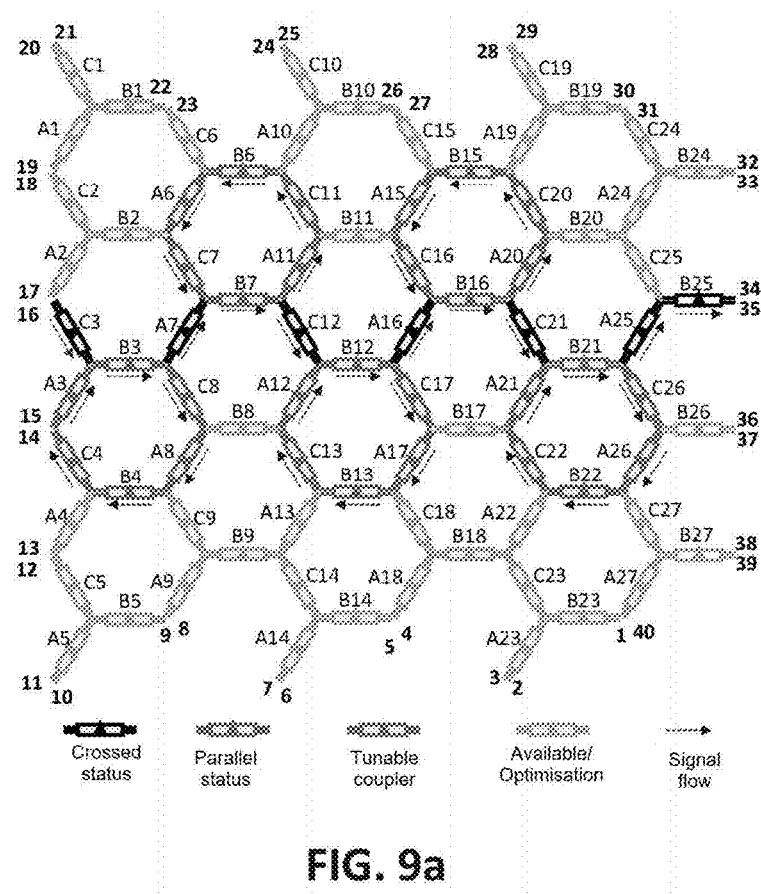
Figure 9B:
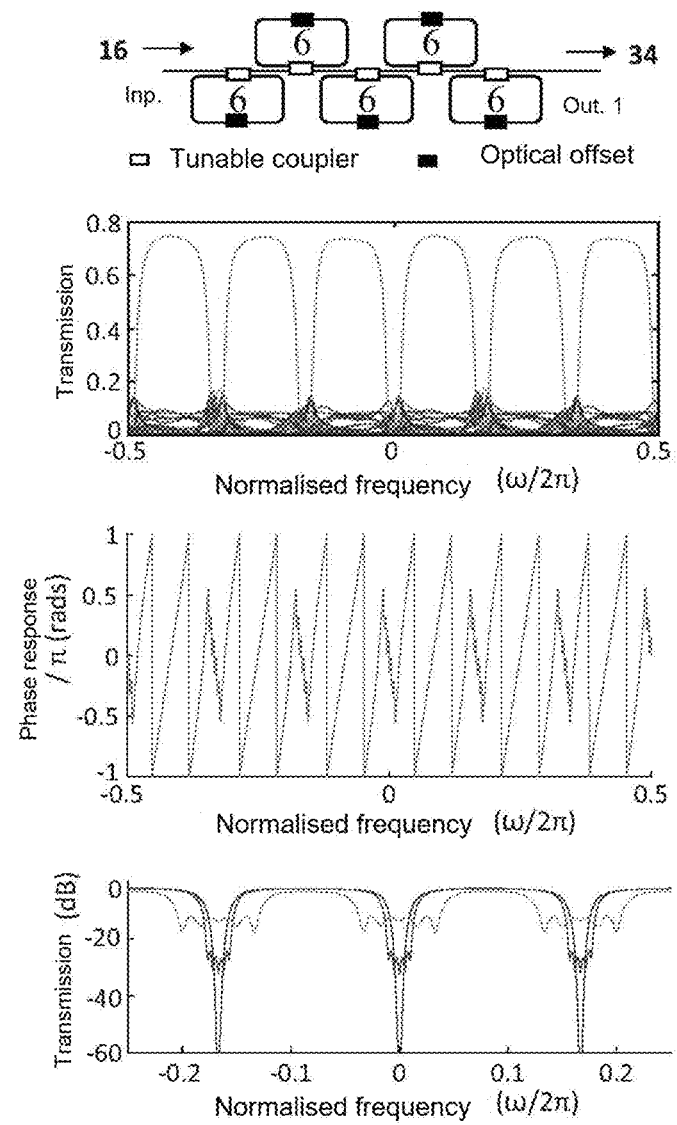
Figure 10A:
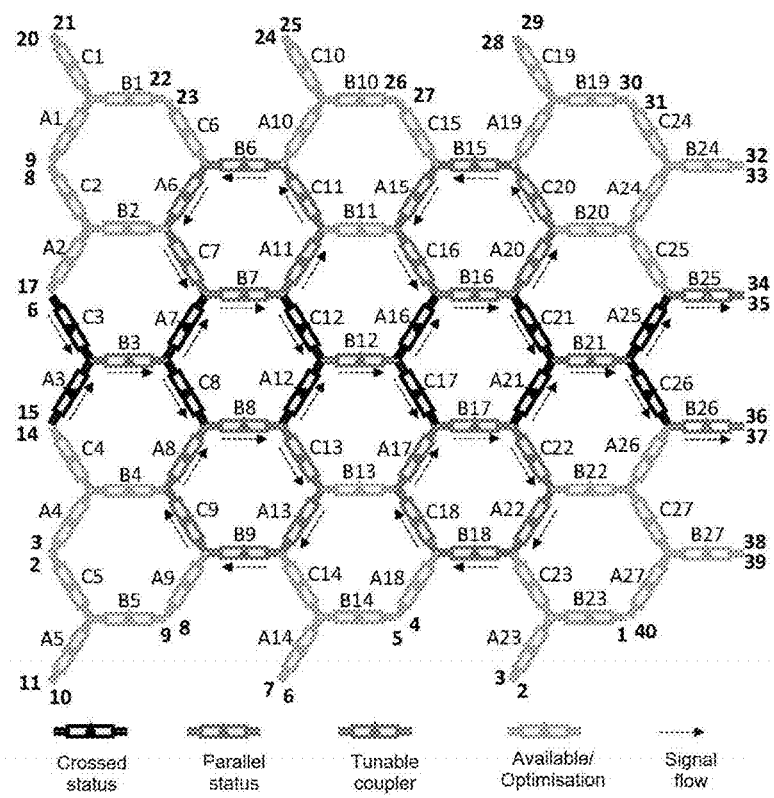
Figure 10B:
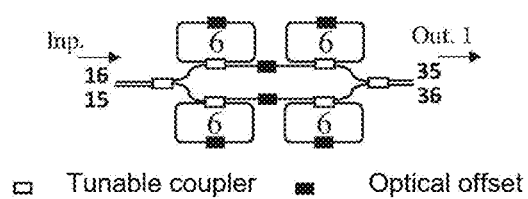
Figure 10C:
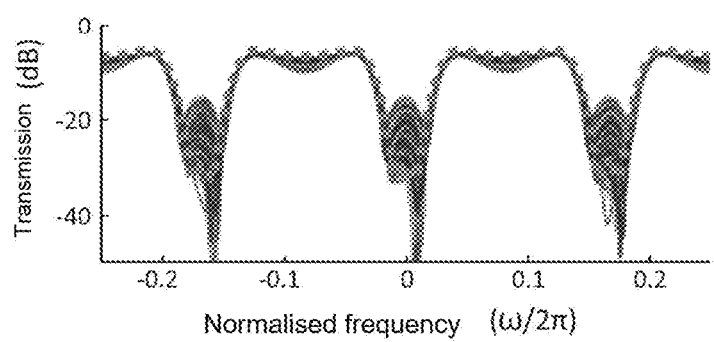
Figure 10D:
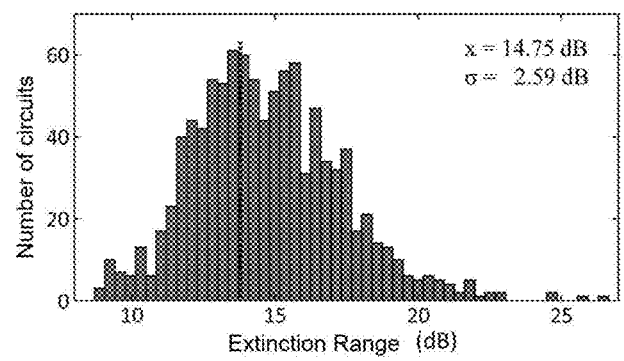
Figure 10E:
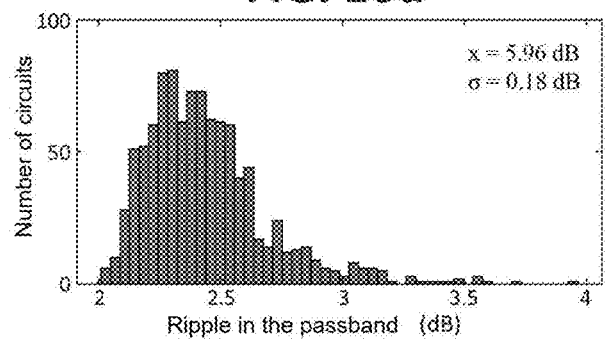
Figure 10F:
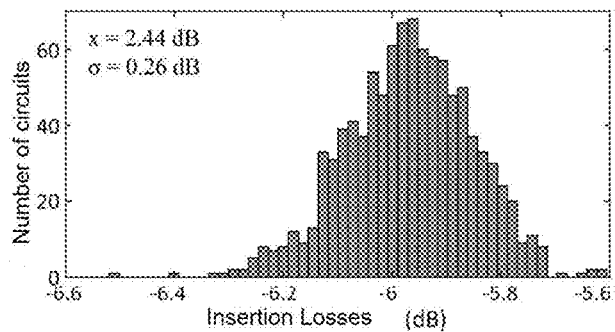
Figure 11A:
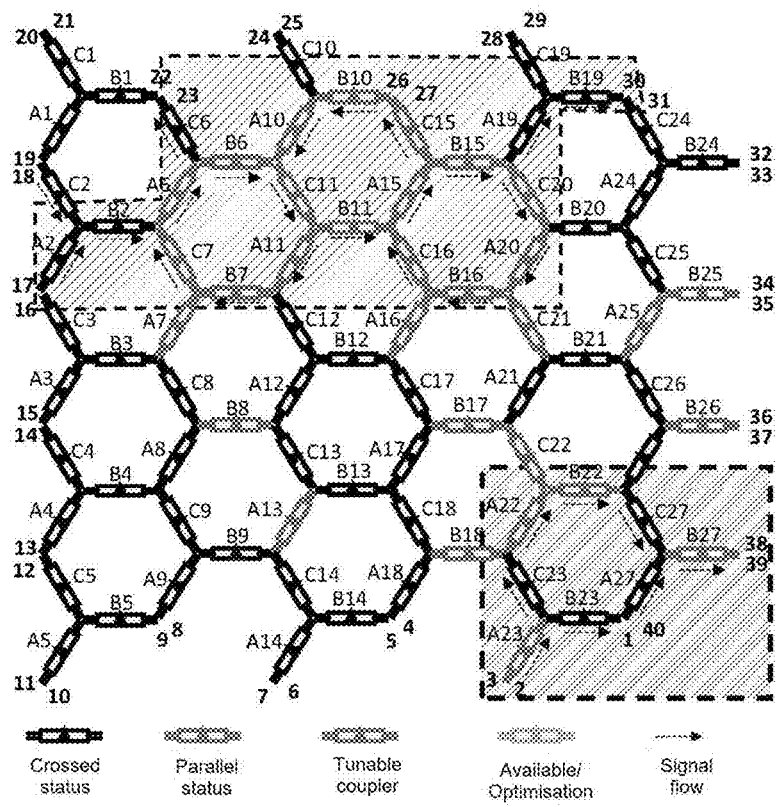
Figure 11B:
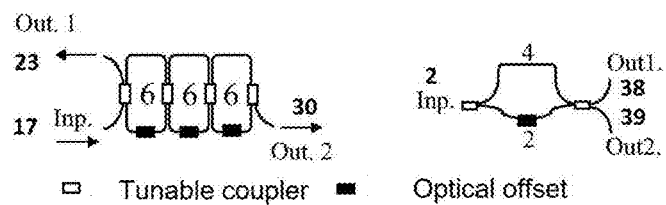
Figures 11C, 11D:
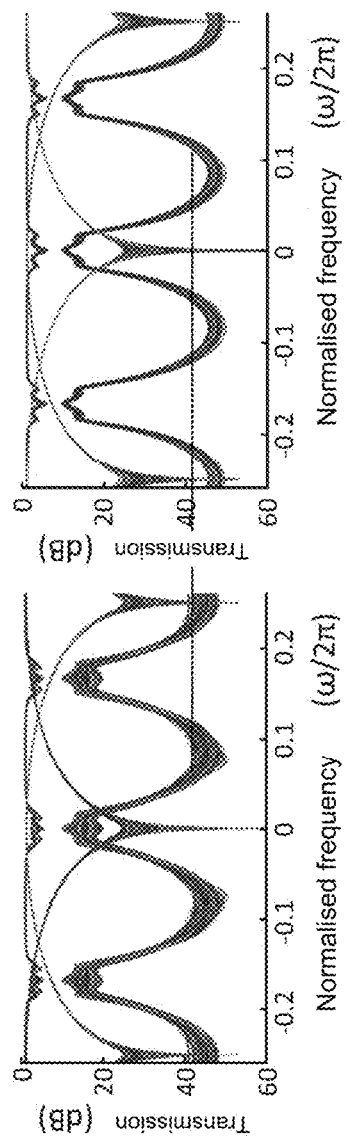
Figure 11E:
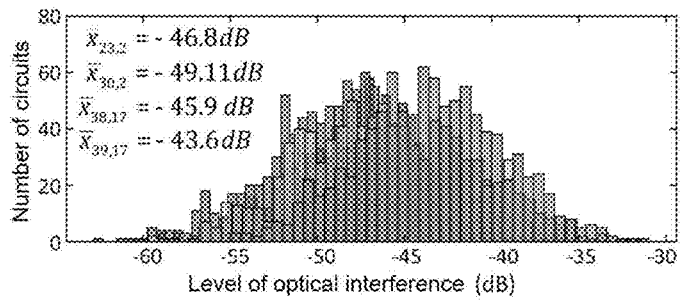
Figure 11F:
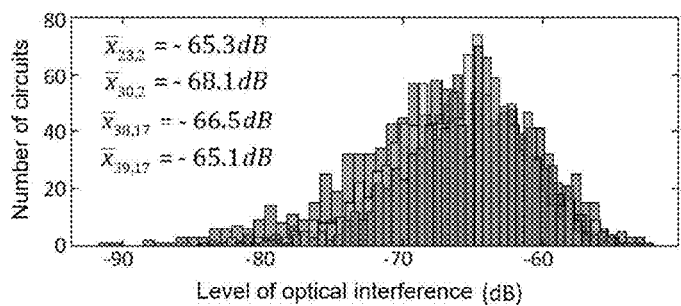
Figure 11G:
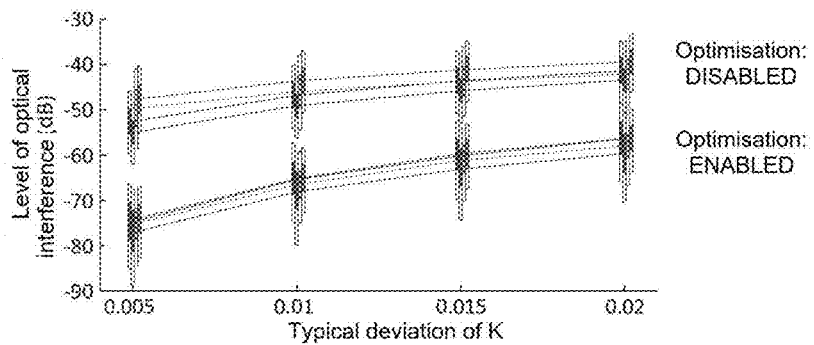

FIGS. 9-11 depict practical examples of use of the method and the technical advantages obtained. In the first case, a structure has been configured that implements an optical filter based on interferometric cavities and the response thereof has been evaluated for each combination of explored TBU configurations. For the second case (FIG. 10), the mesh is programmed to perform a complex optical circuit formed by 4 resonant cavities loaded in a balanced MZI interferometer. The optimisation is carried out to evaluate the performance related to the filtering (extinction range, losses and ripple in the passband). For the third case (FIG. 11), the mesh implements two independent circuits. The first is based on three coupled cavities and the second is an unbalanced MZI type two-sample filter. The figure shows that the application of the proposed method returns an improvement in the reduction of optical interferences between circuits, improving the performance of both.

PREFERRED EMBODIMENT OF THE INVENTION

In a preferred exemplary embodiment of the object of the invention, the starting point is a 2D waveguide mesh formed from the replication of a basic tuning element implemented by means of two waveguides coupled by an independent (in power and phase division) tunable basic unit (TBU), tunable basic unit (TBU) that is configured by means of tuning elements based on: MEMS, thermo-optical tuning, electro-optical tuning, or optomechanical or electro-capacitive tuning.

Figure 3:
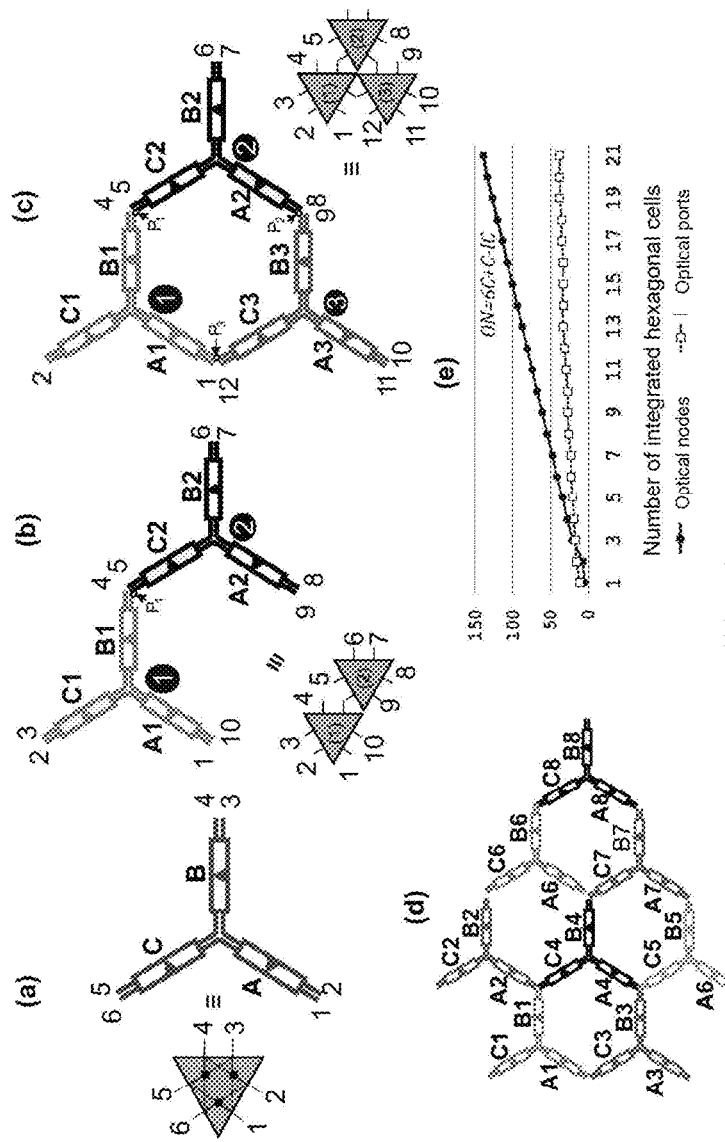
FIG. 3 shows the tri-TBUs building block for 2D hexagonal waveguide meshes and the magnification ratio between the number of optical nodes and optical ports with the number of cells. (a), tri-TBU made up of three TBUs and associated symbol, (b), two tri-TBUs interconnected by the optical node P1, (c) Three tri-TBUs that create a closed hexagonal cell, (d), eight tri-TBUs interconnected to obtain a waveguide mesh formed by four cells. (e), number of optical nodes (ON) and optical ports versus number of closed cells (C) in a meshed waveguide IC integrated photonic circuit.

This tunable basic unit (TBU) can be preferably implemented by means of balanced, tunable Mach-Zehnder interferometers (MZI), or by means of a double actuation directional coupler and representable by means of a $H_{TBU}$ 2×2 transmission matrix. Depending on the orientation and the interconnection of the TBUs, uniform (square, hexagonal, triangular etc.) or non-uniform topologies are originated if each TBU has an arbitrary length and orientation. Next, a theoretical segmentation in TBUs or subset of TBUs of the target mesh is performed to apply the implementation of mathematical induction (MI). In the case of hexagonal waveguide meshes, an option for the basic or tri-TBU building block is made up of three TBUs (A, B, and C) connected in a Y-configuration as shown in FIG. 3.a. The tri-TBU set is described by means of a 6×6 dispersion matrix calculated from the three $H_{TBU}$ dispersion matrices that describe the respective internal TBUs thereof. To aid in the graphical illustration of the method, we will use a triangle symbol to represent the tri-TBU, wherein each port has, in principle, internal connections to the four opposite ports (that is, port 1 to ports 3, 4, 5, 6, etc.). The tri-TBU can be replicated and distributed N times to generate any desired hexagonal mesh arrangement of any size. For example, FIGS. 3b and 3c show the process that leads to the construction of a single hexagonal cell made up of three tri-TBUs (we will use the notation Ai, Bi, Ci to identify the TBUs that make up the tri-TBU i).

Even for the simplest structure represented by the unit cell, there are already twelve input/output ports and six intermediate auxiliary nodes required for the calculation of the 12×12 transfer matrix (that is, 144 elements). With an increasing number of cells, the above figures show a drastic increase. For example, the four-cell structure shown in FIG. 3.d, which is still a low-complexity structure, has twenty input/output ports, thirty-eight internal nodes, and a 20×20 dispersion matrix (i.e., 400 elements). FIG. 3.e provides the exact number of input/output ports and internal nodes according to the number of hexagonal cells, and clearly shows that the analytical derivation of dispersion matrices for 2D meshes becomes seemingly unapproachable even for a very low cell count.

Also, the numerical methods to analyse the responses of the circuits, such as the FDTD (finite-difference time domain) and eigen-mode based solutions, do not scale well as the number of components in the photonic circuit increases.

Formally, the method object of the invention is expressed as follows, a 2D structure formed by a tri-TBU is described by a unitary dispersion matrix H (1) with known coefficients. Then, if a 2D structure formed by n−1≥1 tri-TBUs is described by means of a unitary dispersion matrix H (n−1) with known coefficients, the structure made up of n tri-TBUs obtained by adding an additional H (1) tri-TBU to the first is described by means of a unitary dispersion matrix H (n) with known coefficients.

Figure 1:
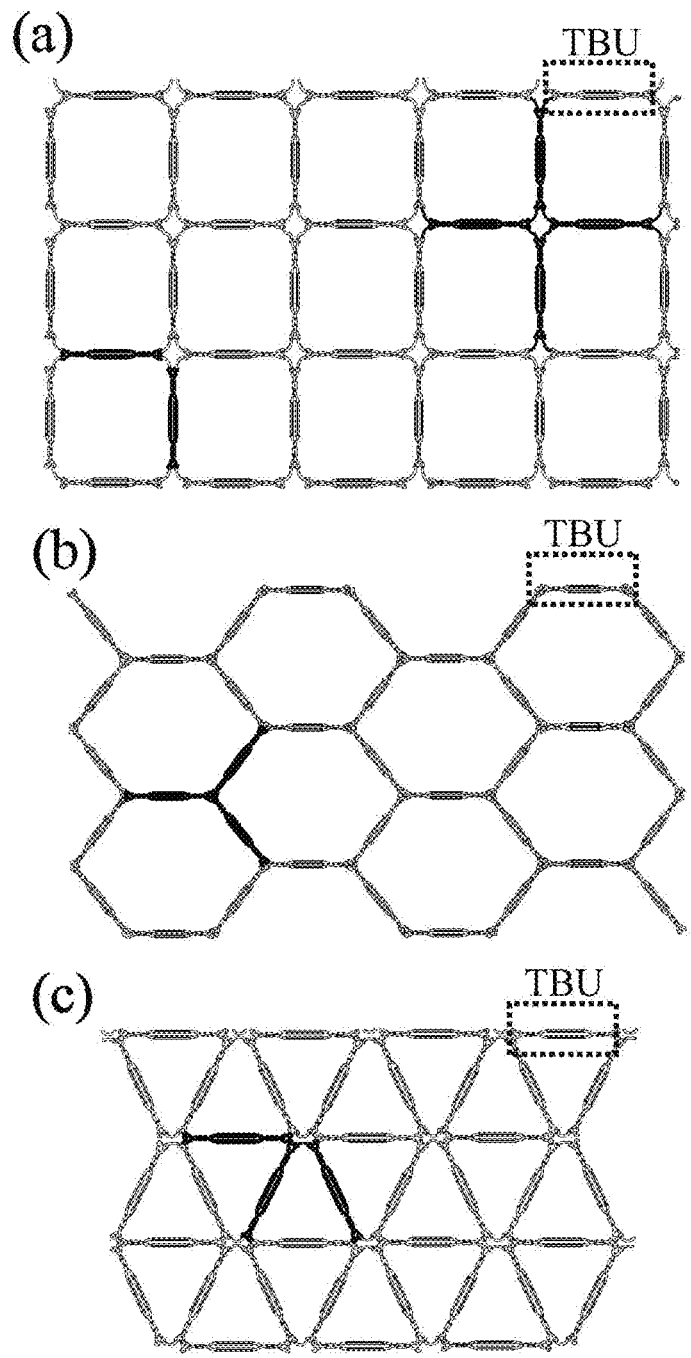
FIG. 1 shows different meshed circuits and segmentation options in TBUs or subset of TBUs. All of them and any circuit that can be discretised in identical tuning units are eligible the application of the disclosed method. (a) Square mesh application, (b) hexagonal mesh application, (c) triangular mesh application.
Figure 2:
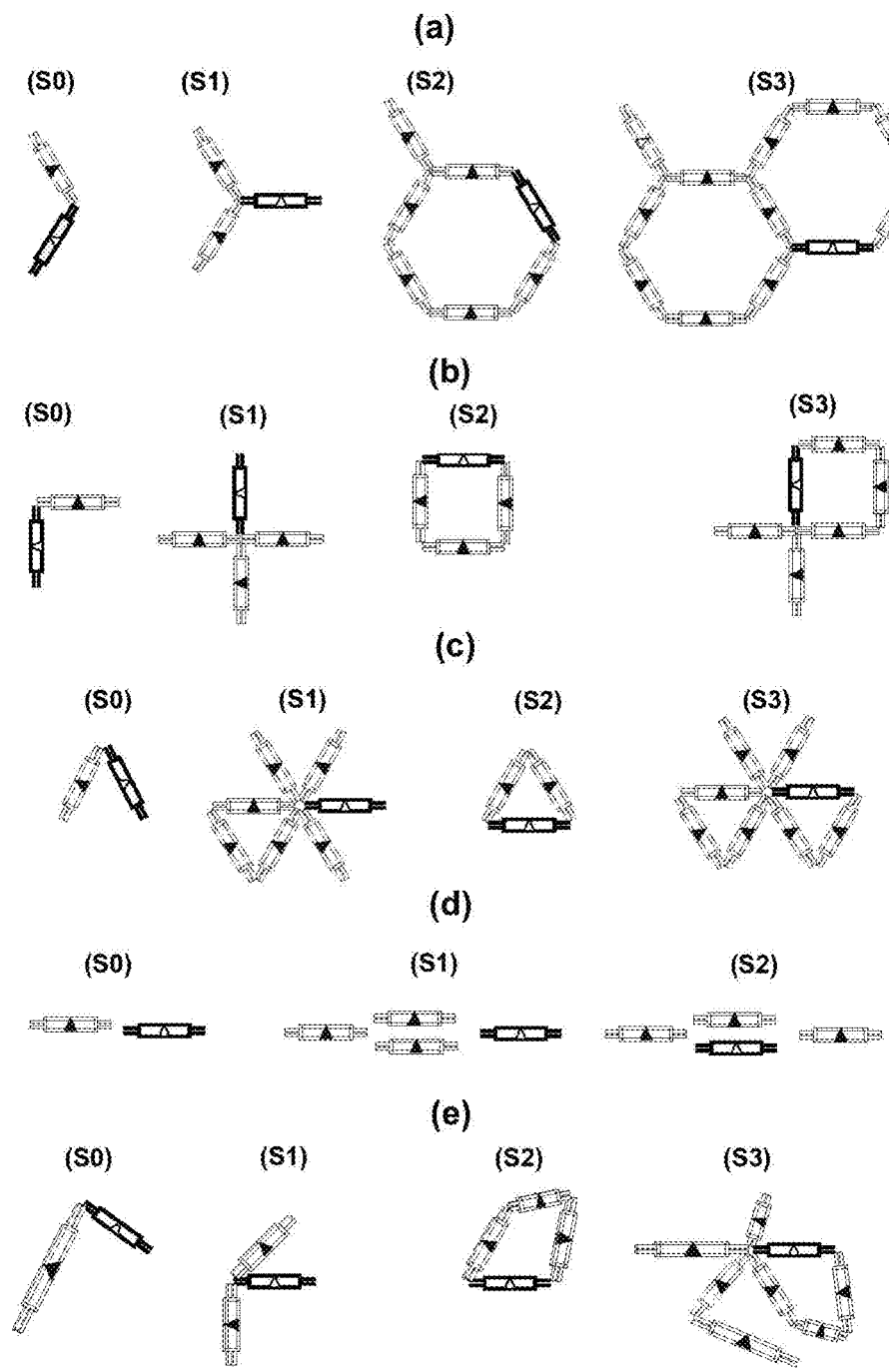
FIG. 2 shows the discretisation in TBUs for different meshed circuit topologies (a) Hexagonal uniform, (b) Square uniform, (c) Triangular uniform, (d) Unidirectional propagation uniform interferometer and (e) non-uniform wherein each TBU can have a different orientation and size.
Figure 4:
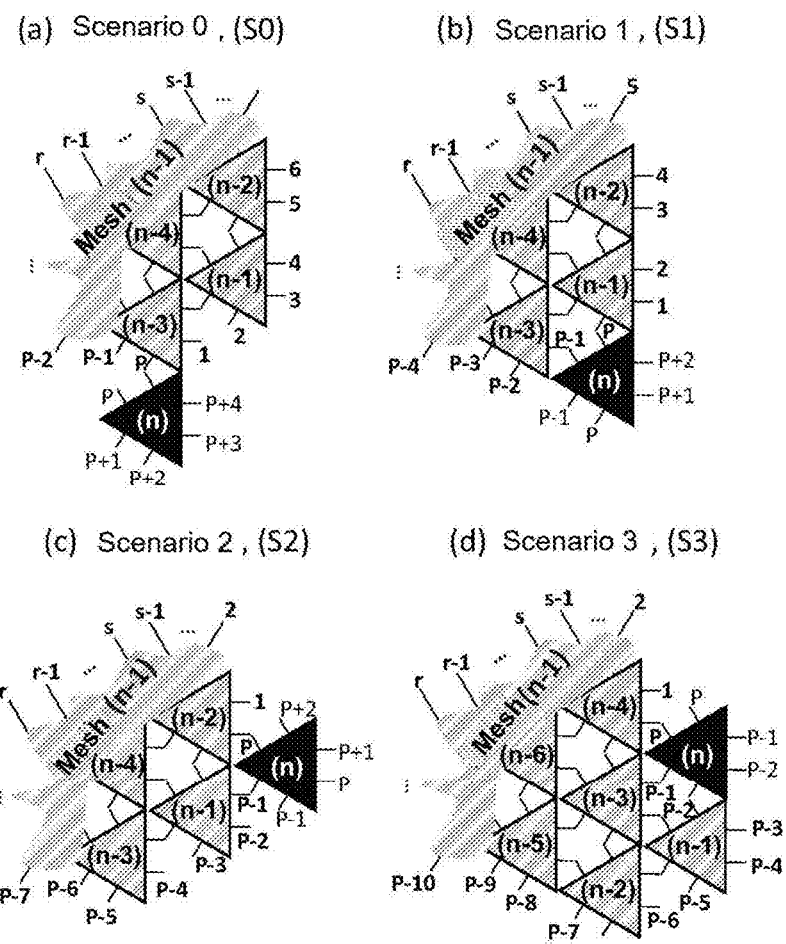
FIG. 4 depicts the inductive method to obtain the dispersion matrix H(n) of a 2D hexagonal waveguide mesh made up of n basic tri-TBU units by adding one tri-TBU unit H(1) to a 2D hexagonal waveguide mesh composed of n−1 basic tri-TBU units H(n−1) and a general signal flow diagram to derive H(n) as a function of h(n−1) and H(1).a, Interconnection Scenario 0.b, Interconnection Scenario 1.c, Interconnection Scenario 2.d, Interconnection Scenario 3.
Figure 5:
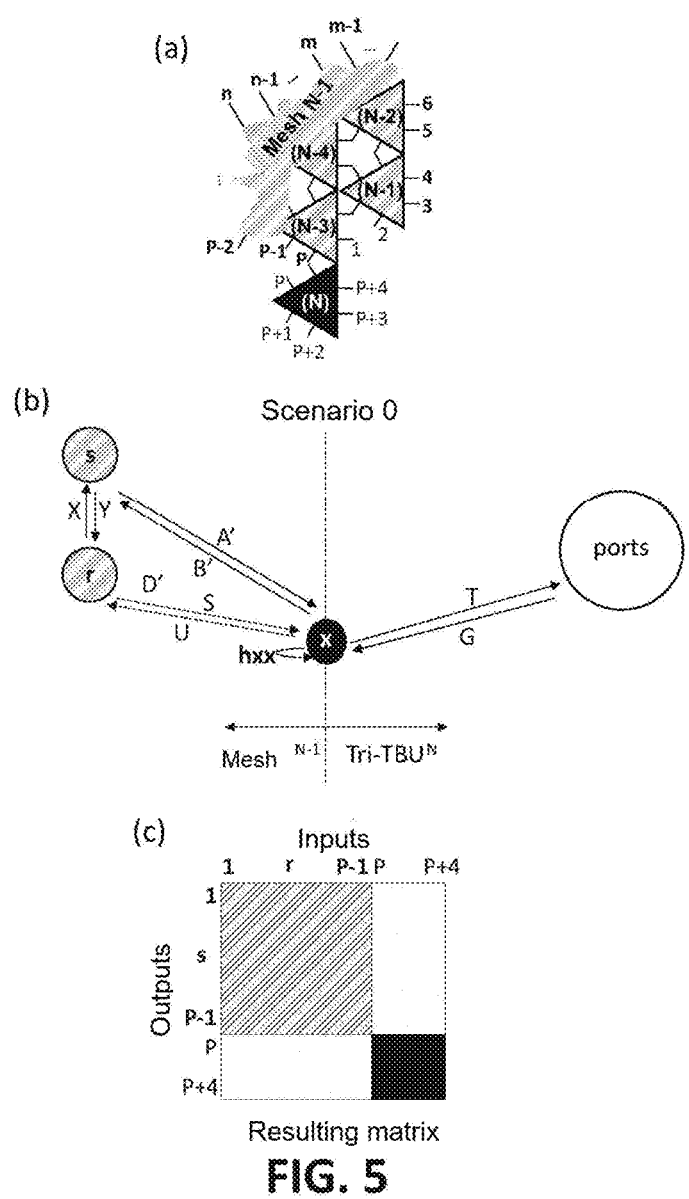
FIG. 5 depicts scenario 0. (a) Connection diagram with mesh n−1, (b) interconnection diagram with the label contributions, (c) resulting sections of the matrix. S1:x=P−1. The direct contribution within the ports of network N is not included in the graph.

This method enables the sequential derivation of the dispersion matrix of an arbitrary n-order hexagonal waveguide mesh using the above lower-order mesh dispersion matrix H (n−1) and that of the newly added H (1) tri-TBU. The final calculation thereof will depend on how the additional tri-TBU connects to the above lower order mesh. Four different interconnection scenarios can be identified, as shown in FIG. 2a, 4.a to 4.d, depending on the number of ports that are interconnected and the number of new complete hexagonal cells that appear after incorporating the new tri-TBU.

In a first scenario, scenario 0, referring to the simplest case that represents the starting point of the design of a new mesh, only one of the 6 ports that define the triple frame is connected to the ports of the previous mesh. Adding the new tri-TBU increases the number of mesh ports by 4, correspondingly increasing the number of rows and columns in the dispersion matrix.

In a second scenario, Scenario 1, adding the new tri-TBU increases the number of mesh ports by 2, but the number of complete hexagonal cells does not increase.

In a third scenario, scenario 2, adding the new tri-TBU increases the number of ports by 2 and the number of complete cells by 1.

In a fourth scenario, scenario 3, adding the new three-lattice network does not increase the number of ports, as it connects 3 ports to the previous mesh and the number of complete cells increases by 1.

FIGS. 5-8 depict for each scenario the more general signal flow diagram that must be taken into account to derive the overall dispersion matrix H(n) according to H(n−1) and H(1). The nodes s, r shown on the left side represent any pair of input and output ports respectively (the ranges of variation allowed for s, r are also displayed depending on the scenario, wherein P is the input/output port count of H(n−1) before connecting the additional tri-TBU). The nodes x,y,z identify the input/output ports of H(n−1) that are used to connect this mesh to the newly added tri-TBU (the allowed values for x,y,z are also shown according to the scenario). In FIGS. 5-8 the connections N, M, X, Y, F, D E', F', Q, R, C', D', A', B', S, U, I, J, B, F, hyy, hzz, hxx represent signal flow pathways with transfer functions given by the coefficients of the dispersion matrix H(n−1). While the connections K, L, O, P, A, H, C, E, T, G, V, W represent the additional signal flow pathways that result from the additional tri-TBU. The transfer functions (additional matrix coefficients) for these connections must be calculated to obtain the overall dispersion matrix H(n).

In order to carry out the aforementioned derivatives, the four scenarios described above are used, in this way we have:

In scenario 0 only one of the 6 ports of the new tri-TBU (Latt N) which is added to H(n−1) is connected to the order mesh n−1. As shown in FIG. 4.a, adding one tri-TBU (Latt N) increases the number of mesh ports by 4, and correspondingly, the number of rows and columns in the dispersion matrix H(n). The interconnection diagram, shown in FIG. 5b, depicts the possibilities of signal flow within the order mesh n−1 and between this mesh and the newly added tri-TBU through the interface node x=P. This interconnection diagram defines a system of equations associated to the node x which can be solved, giving rise to the following equations (Eq. 1) that provide the matrix coefficients that characterise the new waveguide mesh ports:

Submatrix 1 coefficients: $h_{s,r} = X = h_{s,r}^{N-1}$.

Submatrix 2 coefficients: $h_{s,(P,\ldots,P+4)}^{N} = GB'$

Submatrix 3 coefficients: $h_{(P,\ldots,P+4),r}^{N} = TS$,

Submatrix 4 coefficients: $h_{(P,\ldots,P+4),(P,\ldots,P+4)}^{N} = Th_{XX}G + \text{IntCon}$, (1)

wherein IntCon represents the internal connections given by the dispersion matrix of the triple-framed additional unitary cell latt n.

Figure 6:
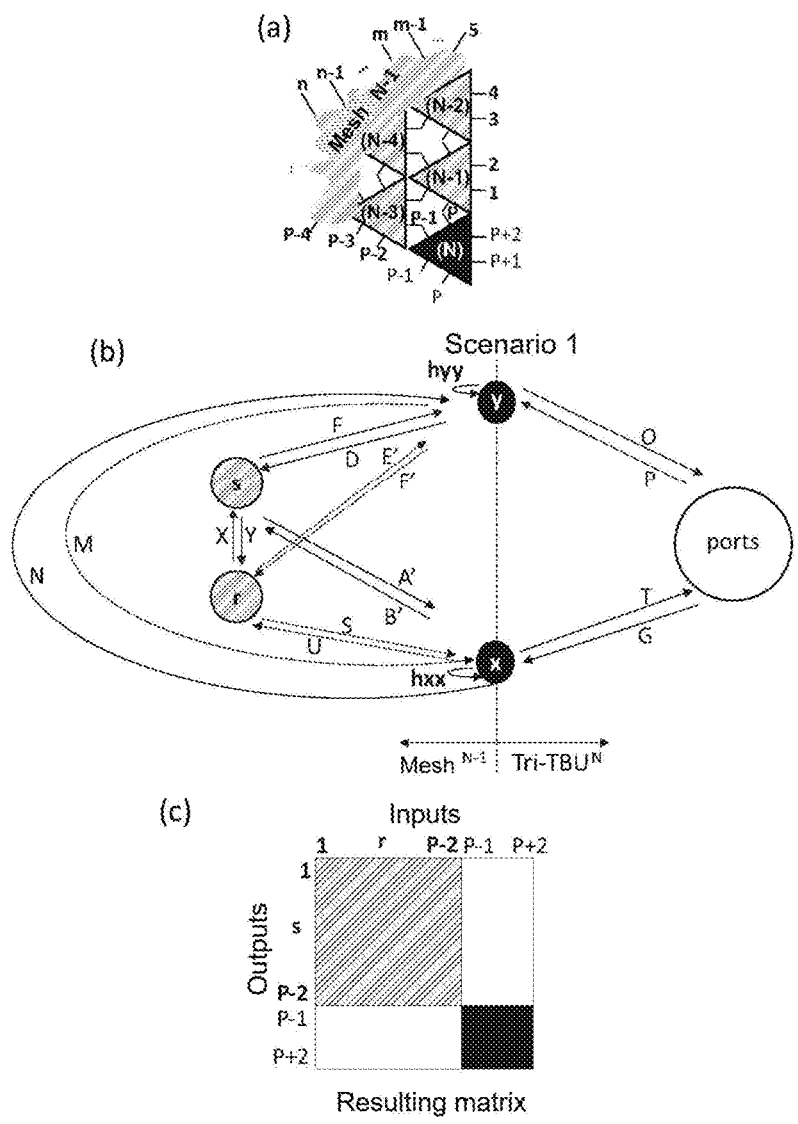
FIG. 6 depicts scenario 1. (a) Connection diagram with mesh n−1, (b) interconnection diagram with the label contributions, (c) resulting sections of the matrix. S1:x=P−1, y=P. The direct contribution within the ports of network N is not included in the graph.

Scenario 1: here, adding the new tri-TBU latt n increases the number of mesh ports by two but the number of complete hexagonal cells does not increase, as shown in FIG. 6.a. FIGS. 6.b and 6.c wherein the associated interconnection diagram to be solved and the resulting matrix for the order mesh are n respectively depicted. In this case, the resulting equations are more complex since two interface nodes are required (x=P−1 e y=P). Solving the system of equations related to the nodes x=P−1 and y=P equations (Eq. 2) are obtained that provide the matrix coefficients that characterise the new waveguide mesh ports and the four sub-matrices:

SM1 $h_{s,r} = X = h_{s,r}^{N-1}$,

SM2 $h_{s,(P-1,\ldots,P+2)} = B'G + DP$,

SM3 $h_{(P-1,\ldots,P+2),r} = OE' + TS$,

SM4 $h_{(P-1,\ldots,P+2),(P-1,\ldots,P+2)} = (h_{xx}G + PM) + O(h_{yy}P + GN)$. (2)

In scenario 2 adding the new tri-TBU increases the number of ports by two and the number of complete hexagonal cells by one, as shown in FIG. 7.a. In this case, the signal flow diagram is shown in FIG. 7.b, wherein the possibility is included of recirculation between the interface nodes x=P−1 and y=P and the newly added tri-TBU unit latt n as shown in the connections V, W. The procedure is similar to the two above scenarios 0 and 1, solving the system of equations associated to the nodes y, x; in this way, solving the system of equations related to the nodes x=P−1 and y=P equations (Eq. 3) are obtained that provide the dispersion matrix coefficients that characterise the new waveguide mesh ports and the four sub-matrices:

(3)

SM1

$$h_{s,r} = X + \left[\frac{DW[h_{xx}^{(N-1)}VE' + (1-VN)S] + B'V[h_{yy}^{(N-1)}WS + (1-MW)E']}{(1-VN)(1-MW) - h_{xx}^{(N-1)}h_{yy}^{(N-1)}VW}\right],$$

SM2

$$h_{s,(P-1,\ldots,P-2)} = UG + F'P + \frac{\left(F'W[h_{xx}^{(N-1)}(G + VPh_{yy}^{(N-1)}) + (1-VN)MP] + UV[h_{yy}^{(N-1)}(P + WGh_{xx}^{(N-1)}) + (1-MW)NG]\right)}{(1-VN)(1-MW) - h_{xx}^{(N-1)}h_{yy}^{(N-1)}VW},$$

SM3

$$h_{(P-1,\ldots,P+2),r} = \frac{\left(O[h_{yy}^{(N-1)}WS + (1-MW)E'] + T[h_{xx}^{(N-1)}VF + (1-NV)S]\right)}{(1-VN)(1-MW) - h_{xx}^{(N-1)}h_{yy}^{(N-1)}VW}$$

SM4

$$h_{(P-1,\ldots,P+2),(P-1,\ldots,P+2)} = \frac{\left(O[h_{yy}^{(N-1)}P + h_{yy}^{(N-1)}Wh_{xx}^{(N-1)}G + (1-MW)NG] + T[h_{xx}^{(N-1)}G + h_{yy}^{(N-1)}Vh_{xx}^{(N-1)}P + (1-VN)MP]\right)}{(1-VN)(1-MW) - h_{xx}^{(N-1)}h_{yy}^{(N-1)}VW} + \text{IntCont}.$$

In the third scenario, as shown in FIG. 8.a, adding the new tri-TBU does not increase the number of ports, as it connects three ports to the previous mesh and the number of complete cells is increased by one. Here, the interconnection diagram involves three interface nodes x,y,z, (represented in FIG. 8b). The procedure to obtain the coefficients of the different sub-matrices is similar to the three previous scenarios, but with more complexity given the complexity of the result of the addition, which leads to:

SM1

$\xi_2 = C(MK + H_{xx}E) + L(NE + H_{yy}K)$, $\xi_1 = 1 - FE - IK - H_{zz}\xi_2$, $z_1 = \frac{(C'(1 - BC - JL) + (SC + E'L)Hzz)}{(\xi_1(1 - BC - JL) - (BC + JL)Hzz\xi_2)}$, $z_4 = \frac{(CS + LE' + \xi_2 z_1)}{(1 - CB - LJ)}$, -continued $$h_{s,r} = X + (DK + B'E)z_1 + Rz_4.$$

SM2

$$\xi_2 = C(MK + H_{xx}E) + L(NE + H_{yy}K),$$

$$\xi_1 = 1 - FE - IK - H_{zz}\xi_2,$$

$$z_1 = \frac{((1 - BC - JL) + (IP + FG) + H_{zz}(H + CH_{xx}G + CMP + LH_{yy}P + LNG))}{(\xi_1(1 - BC - JL) - (BC + JL)H_{zz}\xi_2)},$$

$$z_4 = \frac{(H + CH_{xx}G + CMP + LH_{yy}P + LNG + z_1\xi_2)}{(1 - BC - JL)}$$

$$h_{s,(P-1,\ldots,P+2)} = D(P + Kz_1) + Rz_4 + B'(G + Ez_1).$$

SM3

$$\chi_1 = NE + H_{yy}K, \chi_2 = MK + H_{xx}E, \chi_3 = 1 - IK - FE,$$

$$\alpha_1 = (1 - BC)\chi_1 + JC\chi_2, \alpha_2 = (1 - BC)\chi_3 - CH_{zz}\chi_2,$$

$$\beta_1(1 - BC)E' + JCS, \beta_2 = -(1 - BC)C' - CH_{zz}S,$$

$$z_5 = \frac{(1 - BC - JL)\beta_2 - H_{zz}L\beta_1}{(H_{zz}L\alpha_1 - (1 - BC - JL)\alpha_2)},$$

$$y_3 = \frac{\beta_1 + \alpha_1 z_5}{(1 - BC - JL)},$$

$$x_3 = (S + BLy_3 + \chi_2 z_5)/(1 - BC),$$

$$h_{(P-1,\ldots,P+2),r} = Oy_3 + Az_5 + Tx_3.$$

SM4

$$\chi_1 = NE + H_{yy}K, \chi_2 = MK + H_{xx}E, \chi_3 = 1 - IK - FE,$$

$$\alpha_1 = -\chi_2(H_{yy}P + JH + NG) + \ldots \chi_1(H_{xx}G + BH + MP),$$

$$\alpha_2 = (1 - BC)\chi_1 + JC\chi_2,$$

$$\alpha_3 = -\chi_3(H_{xx}G + BH + MP) - \ldots \chi_2(H_{zz}H + IP + FG),$$

$$\alpha_4 = \chi_2 CH_{zz} - \chi_3(1 - BC),$$

$$\beta_1 = (1 - JL)\chi_2 + BL\chi_1, \beta_2 = \chi_3 BL + \chi_2 H_{zz}L,$$

$$y_3 = (\alpha_3\alpha_2 - \alpha_1\alpha_4)/(\alpha_4\beta_1 + \alpha_2\beta_2),$$

$$x_3 = (-y_{3'} * \beta_2 + \alpha_3),/\alpha_4,$$

$$z_5 = (y_3(1 - JL) - H_{yy}P - JH - JCx_3 - NG)/\chi_1,$$

or $$z_5 = (H_{zz}H + IP + FG + H_{zz}Cx_3 + H_{zz}Ly_3)/\chi_3,$$

$$h_{(P-1,\ldots P+2),(P-1,\ldots P+2)} = Oy_3 + Az_5 + Tx_3 + IntCont.$$

This completes the complete set of analytical expressions that enable the core of the algorithm responsible for evaluating the dispersion matrix that defines the system given the values of each TBU to be implemented. The core of the method is then recursively used to configure and optimise mesh performance.

By way of example of implementation, a series of experimental results are provided in this document that reinforce the previous assertions regarding the flexibility and the advantages of the object of the invention.

In this way, the method of the invention is applied to configure, optimise and evaluate circuits of different degrees of complexity implemented by programming a 40 input/40 output waveguide mesh. This involves calculating 40×40=1600 matrix coefficients subject to varying conditions imposed by the large number of possible combinations of individual configuration of the parameters of each TBU. Furthermore, for each wavelength, the method object of the invention makes it possible to evaluate the 40×40 matrix in a few seconds for each iteration of the optimisation/configuration process.

The invention claimed is:

1. A method of configuration and optimisation of programmable optical devices based on meshed optical structures, a meshed optical structure comprising a highly coupled structure defined by at least three or more tunable basic units implemented with two coupled waveguides providing independent values of power and phase division; wherein the method comprises the steps of:
   a. segmenting an entire mesh into tunable basic units or subsets of tunable basic units in the initial configuration,
   b. determining a complete frequency response with the tunable basic units or subsets of tunable basic units in the initial configuration, wherein said complete response comprises amplitude and phase of input/output ports of a 2D waveguide mesh,
   c. calculating at least one parameter of the 2D waveguide mesh from a result of the preceding step (b), and
   d. modifying the initial configuration of at least one tunable basic unit or subsets of tunable basic units based on the at least one parameter calculated in the preceding step.

2. The method according to claim 1 wherein the complete frequency response of the entire mesh is obtained by applying an inductive method wherein a resulting matrix is obtained with a matrix that defines a mesh formed by n−1 subsets of tunable basic units and a matrix that defines an additional subset that is connected to the mesh formed by n−1 subsets of tunable basic units.

3. The method according to claim 2 wherein a number of input/output ports to connect and a number of new cavities originated after the interconnection of each new subset of tunable basic units defines a different interconnection scenario selected from:
   a. a scenario 0 defined by the interconnection in a single port,
   b. a scenario 1 defined by the interconnection of two ports no giving rise to one new cavity,
   c. a scenario 2 defined by the interconnection of two ports giving rise to one new cavity, and
   d. a scenario 3 defined by the interconnection of three ports giving rise to one new cavity.

4. The method according to claim 1 wherein an evaluation and a modification of the tunable basic units are carried out using recursive algorithms.

5. The method according to claim 4 wherein the recursive algorithms comprise:
   a. selecting elements that make up a main circuit to be programmed,
   b. selecting a subset of tunable basic units adjacent to the main circuit to be used and modifying a configuration of the tunable basic units,
   c. performing an evaluation of the entire mesh of the system that defines a 2D programmable optical mesh,
   d. checking a status of the at least one parameter to be optimised,
   e. calculating a change in configuration of each tunable basic units not present in the main circuit, and
   f. repeating steps b-e recursively until a desired optimisation is reached.

6. The method according to claim 1 wherein the evaluation stage of the programmable circuit combines an analytical evaluation with an experimental monitoring of an optical signal in a subset of the output ports or in internal points of the circuit.

7. The method according to claim 1 wherein at least one of the tunable basic units is a non-resonant interferometer of Mach-Zehnder type.

8. The method according to claim 7 wherein the Mach-Zehnder interferometer is balanced, wherein both arms that make up the interferometer are equal with 3 dB losses.

9. The method according to claim 1 wherein at least one of the tunable basic units is a double actuation directional coupler.

10. The method according to claim 1 wherein at least one of the tunable basic units is a resonant interferometer.

11. The method according to claim 1 wherein at least one of the tunable basic units has an arbitrary number of ports.

12. The method according to claim 1 wherein at least one of the tunable basic units is configured with tuning elements based on: MEMS, thermo-optic tuning, electro-optical tuning, optomechanical or electro-capacitive tuning.

13. The method according to claim 1 wherein the subsets of tunable basic units form uniform topologies of 2D programmable optical circuits.

14. The method according to claim 1 wherein the subsets of tunable basic units form non-uniform topologies of 2D programmable optical circuits.

15. The method according to claim 1 wherein the at least one parameter to be calculated and optimised is related to programming of the programmable optical device.

16. The method according to claim 15 wherein the at least one parameter to be calculated and optimised is selected from a set consisting of: total power consumption, loss reduction, interference and crosstalk reduction, isolation between circuits and reduction of an area used.

* * * * *